United States Patent [19]
Kondou et al.

[11] Patent Number: 5,293,428
[45] Date of Patent: Mar. 8, 1994

[54] OPTICAL APPARATUS FOR USE IN IMAGE RECOGNITION

[75] Inventors: Yasukazu Kondou; Hiroaki Hikita, both of Kyoto, Japan

[73] Assignee: Rohm Co., Ltd., Kyoto, Japan

[21] Appl. No.: 874,801

[22] Filed: Apr. 28, 1992

[30] Foreign Application Priority Data

May 8, 1991 [JP] Japan ................................. 3-102644

[51] Int. Cl.⁵ .............................................. G06K 9/00
[52] U.S. Cl. ........................................ 382/8; 356/390; 359/638; 359/834
[58] Field of Search ............... 382/8, 65; 359/831, 359/834, 836, 638; 356/390, 391, 394, 373

[56] References Cited

U.S. PATENT DOCUMENTS

| | | | |
|---|---|---|---|
| 3,560,082 | 2/1971 | Borch et al. | 359/836 |
| 4,148,065 | 4/1979 | Nakagawa et al. | 382/8 |
| 4,191,477 | 3/1980 | Schick | 356/373 |
| 4,744,659 | 5/1988 | Kitabayashi | 382/43 |
| 4,750,810 | 6/1988 | Domlin et al. | 359/836 |
| 4,881,863 | 11/1989 | Braginsky | 382/8 |
| 4,906,099 | 3/1990 | Casasent | 382/8 |
| 4,940,312 | 7/1990 | Hofmann | 359/836 |
| 4,962,423 | 10/1990 | Yamada | 382/8 |
| 5,086,477 | 2/1992 | Yu et al. | 382/8 |

FOREIGN PATENT DOCUMENTS 2459328  7/1976  Fed. Rep. of Germany.
1691856 11/1991  U.S.S.R..

*Primary Examiner*—Joseph Mancuso
*Attorney, Agent, or Firm*—William H. Eilberg

[57] ABSTRACT

An image recognition apparatus comprises a support for placing thereon an inspection object, an impage pickup unit spaced from the support for detecting an image of the inspection object, and an image alternating unit arranged in an optical path extending between the support and the image pickup unit. The image alternating unit includes a quadratic prism which has a longitudinal axis substantially in parallel to the support, and the quadratic prism has two incident surfaces directed toward the support and two exit surfaces directed away from the support.

14 Claims, 4 Drawing Sheets

OPTICAL APPARATUS FOR USE IN IMAGE RECOGNITION

BACKGROUND OF THE INVENTION

1. Field of the Invention

This invention relates generally to optical image recognition. More particularly, the present invention relates to an image recognition apparatus which is used for optically checking an inspection object such as electronic device, printed circuit board, and so on.

2. Description of the Prior Art

For quality control, it is necessary not only to check the performance of an electronic component but also to check the component with regard to its appearance, dimension, mounting state on a printed circuit board, and so on. For instance, a small outline package IC device requires checking with regard to the length, pitch and shape of the leads projecting from both sides of the resinous package.

Conventionally, the external checking of an electronic component is typically performed by using an optical image recognition apparatus. Now, for conveniently explaining the problems to be solved by the present invention, reference is made to FIGS. 6 and 7 of the accompanying drawings. FIG. 6 shows a prior art image recognition apparatus, whereas FIG. 7 shows a small outline package IC device to be optically inspected by the image recognition apparatus.

In FIG. 7, the IC device is shown to have a resinous package M and paired arrays of leads A1-A5, B1-B5 projecting from both sides of the package. Obviously, it is necessary to perform external checking for both arrays of leads.

As shown in FIG. 6, the prior art image recognition apparatus comprises a transparent glass support 100 for supporting thereon the IC device (inspection object), a positioner 101 for horizontally moving the support 100, an illuminator 102 for illuminating the IC device from below, and an image pickup unit (camera) 103 having a microscope. The image recognition apparatus further comprises a central processing unit (CPU) 104 connected to the image pickup unit 103, and a monitor display 105 connected to the CPU. The CPU controls the positioner 101 and the illuminator 102.

As shown in FIG. 7, the image pickup unit 103 provides a visual field 106, whereas the monitor display 105 provides a smaller display field 107. Thus, in order to simultaneously check and monitor the respective arrays of leads A1-A5, B1-B5, the entire image of the IC device must be contained within the display field 107.

As is well known, the resolution of the image pickup unit 103 increases as the magnification of the employed lens system increases, so that higher inspection accuracy will result. On the other hand, higher magnification of the lens system will result in reduction of the visible area within the limited visual field 106 of the image pickup unit 103.

Thus, in the case of checking the respective lead arrays located on both sides of the IC device, one lead array may come out of the visual field 106 (the display field 107 as well) if the image pickup unit 103 employs a high magnification lens system for increasing the image resolution (inspection accuracy), as shown in FIG. 7. In this case, it becomes necessary to perform lead checking twice at two different positions, which requires positional readjustments of the support 100. Further, the CPU 104 must have an additional control function of determining whether the new image taken after positional readjustment is really that of the same IC device.

It is, of course, possible to reduce the magnification of the employed lens system for simultaneously checking the respective lead arrays of the IC device. However, such a solution is inevitably accompanies by deterioration of inspection accuracy.

SUMMARY OF THE INVENTION

Therefore, the present invention aims to provide an image recognition apparatus which is capable of efficiently performing optical checking of an inspection object without the sacrifice of inspection accuracy even if the object has different inspection portions spaced apart by a relatively large amount.

According to the present invention, there is provided an image recognition apparatus comprising: a support for placing thereon a test object; an image pickup unit spaced from the support for detecting an image of the test object; and an image alternating unit arranged in an optical path extending between the support and the image pickup unit; wherein the image alternating unit includes a quadratic prism which has a longitudinal axis substantially in parallel to the support, the quadratic prism having two incident surfaces directed toward the support and two exit surfaces directed away from the support.

Other objects, features and advantages of the present invention will be fully understood from the following detailed description given with reference to the accompanying drawings.

DETAILED DESCRIPTION OF THE PREFERRED EMBODIMENT

Figure 1:
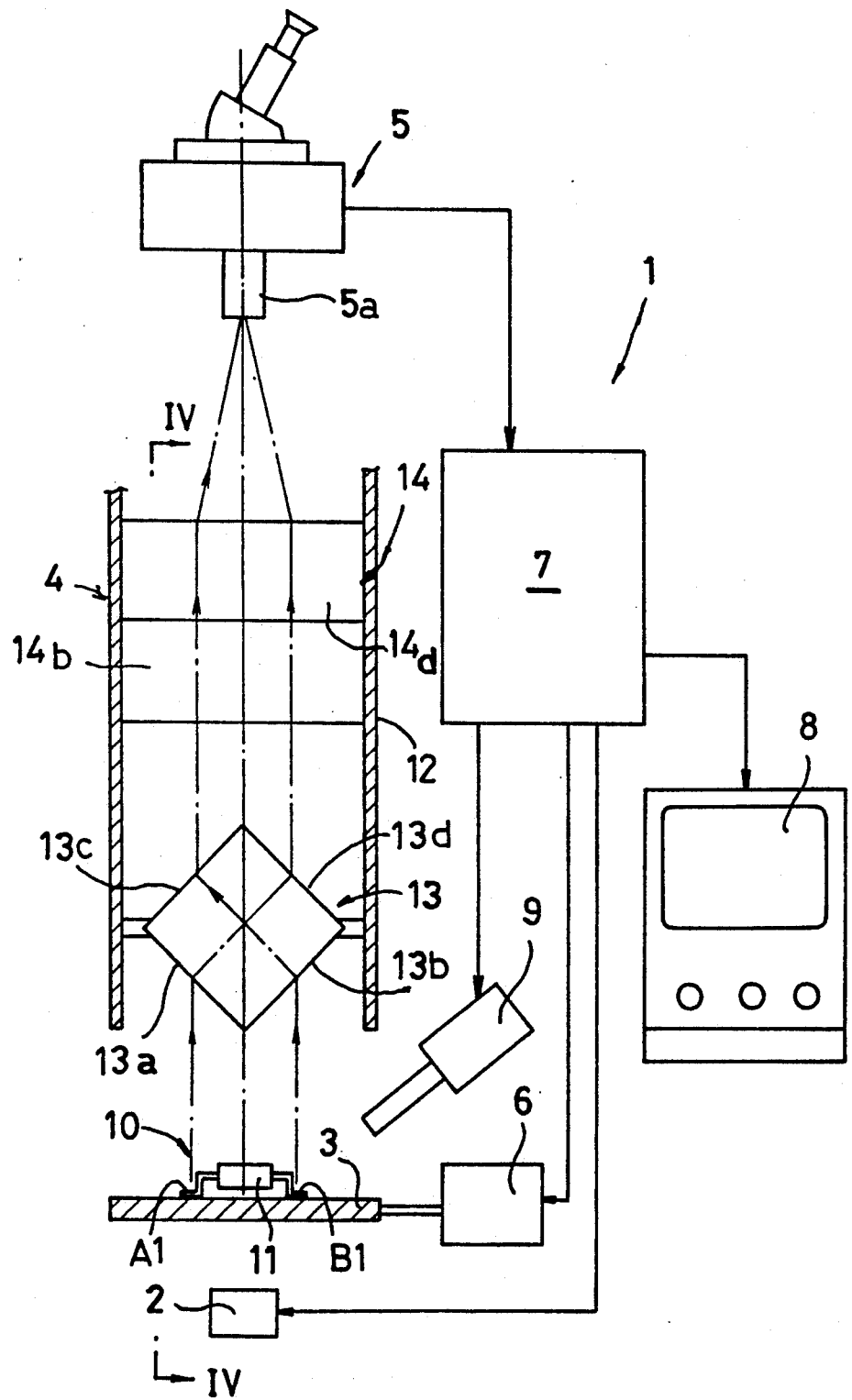
FIG. 1 is a shcematic view, partially in section, showing an image recognition apparatus embodying the present invention.

Referring to FIG. 1 of the accompanying drawings, an image recognition apparatus 1 embodying the present invention comprises an illuminator 2, a transparent support 3, an optical image alternating unit 4, and an image pickup unit (camera) 5. The image recognition apparatus further comprises a positioner 6, a central processing unit (CPU) 7, a monitor display (CRT) 8, and a manipulator 9.

The transparent support 3, which may be made of glass, carries an inspection object 1 which is illuminated by the illuminator 2 from below. For positional adjustment of the object 1, the support 3 can be moved horizontally in X- and Y-directions by the positioner 6. The positioner 6 may comprise stepping motors.

Figure 3:
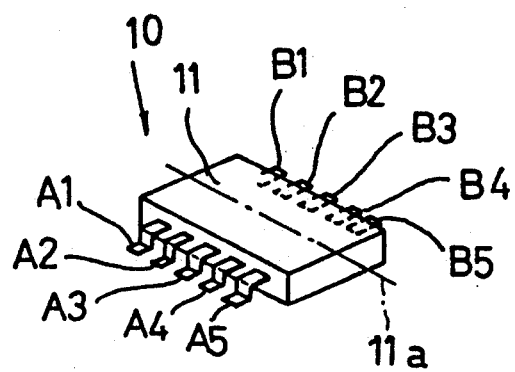
FIG. 3 is a perspective view showing an example of inspection object.

According to the illustrated embodiment, the inspection object 1 is a small outline package IC device which has a resinous package 11 and paired arrays of leads A1-A5, B1-B5 arranged on both sides of a central reference line 11a, as shown in FIG. 3. However, the present invention is equally applicable to any inspection object which has different inspection portions on both sides of a reference line.

The image pickup unit 5 has a magnifying object lens 5a. The pickup unit further incorporates therein two-dimensional CCD elements and other components (not shown) necessary for image recognition. The image pickup unit 5 is connected to the central process unit 7 which, in turn, is connected to the positioner 6, the display 8 and the manipulator 9. Obviously, the movement of the positioner 6 and manipulator 9 is controlled by the CPU 7.

The optical image alternating unit 4 is disposed between the inspection object 10 and the image pickup unit 5. According to the illustrated embodiment, the image alternating unit 4 includes a support tube 12 and two quadratic prisms 13, 14 fixedly supported in the support tube 12 as vertically spaced from each other.

Figure 2:
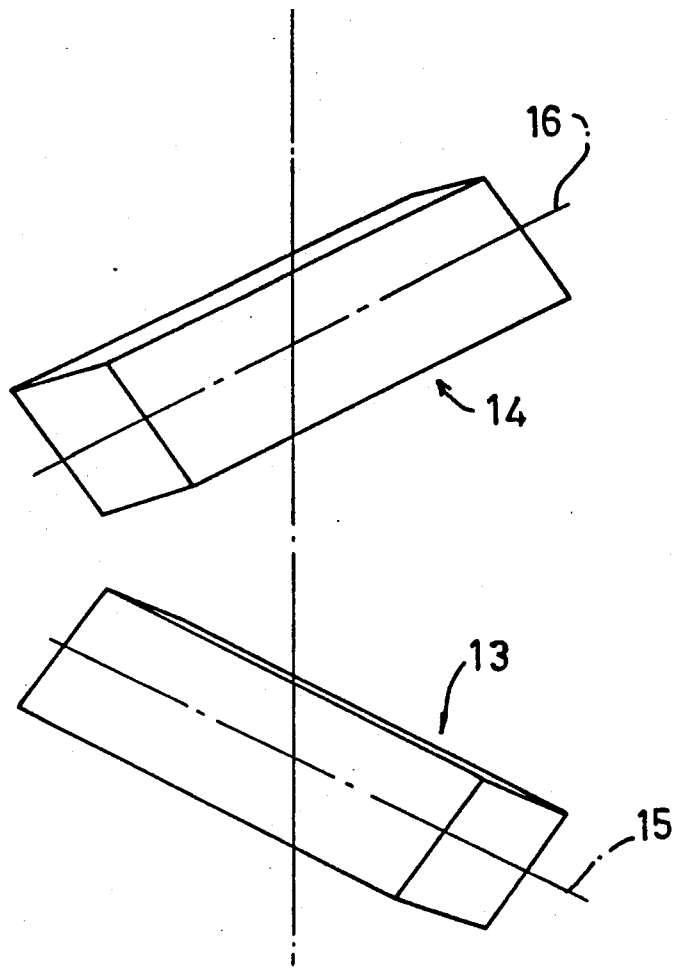
FIG. 2 is a perspective view showing positional relation between the two quadratic prisms incorporated in the image recognition apparatus.

Each of the quadratic prisms 13, 14 has a square cross section. The lower prism 13 has a longitudinal axis 15 (see FIG. 2) and four longitudinal surfaces 13a-13d (see FIG. 1). Similarly, the upper prism 14 has a longitudinal axis 16 (see FIG. 2) and has four longitudinal surfaces 14a-14d (see FIG. 4). The respective prisms 13, 14 are oriented in the following manner.

The lower prism 13 is arranged such that its longitudinal axis 15 is parallel to and aligned with the central reference line 11a of the inspection object 10. Further, two longitudinal surfaces (incident surfaces) 13a, 13b of the lower prism are inclined at 45° relative to the support 3 and made to face the respective arrays of leads A1-A5, B1-B5 (see FIG. 1), whereas the remaining two longitudinal surfaces (exit surfaces) 13c, 13d are directed away from the support 3.

On the other hand, the upper prism 14 is arranged such that its longitudinal axis 16 is parallel to the support 3 and perpendicular to the longitudinal axis 15 of the lower prism 13. Further, two longitudinal surfaces (incident surfaces) 14a, 14b of the upper prism 14 are directed toward the support 3 at an inclination of 45° relative thereto, whereas the other surfaces (exit surfaces) 14c, 14d are directed away from the support 3.

Figure 4:
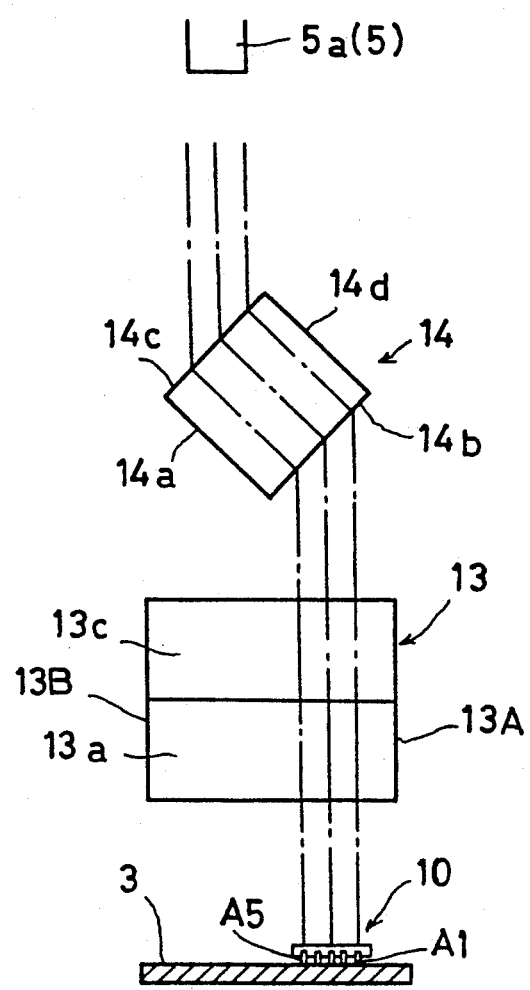
FIG. 4 is a view of the image recognition apparatus as seen in the direction of arrows IV—IV in FIG. 1.

When using the two quadratic prisms 13, 14, it is necessary to arrange the test object 10 at a position offset toward one end 13A of the lower prism 13, whereas the image pickup unit 5 is located offset toward the other end 13B of the lower prism, as shown in FIG. 4. As a result, the image of the inspection object 10 enters the upper prism 14 only at one longitudinal surface 14b thereof, and exits the upper prism only at the opposite longitudinal surface 14c for entry to the image pickup unit 5. Obviously, the inspection object 10 may be located offset toward the other end 13B of the lower prism 13, so that the image of the inspection object enters the upper prism 14 only at another longitudinal surface 14a thereof. The reason for such an offset arrangement will be described later.

In operation, the inspection object 10 is illuminated from below by the illuminator 2, and the image rays enter the lower prism 13 at an incident angle of 45° relative to the incident surfaces 13a, 13b thereof, as shown in FIG. 1. The image rays are refracted upon entering the lower prism at an refraction angle which is determined by $\sin^{-1}(\sin 45°/n)$ where n is the refractive index of the prism material relative to air. The refracted image rays exit out from the respective exit surfaces 13c, 13d of the lower prism at 45° relative thereto. As a result, the image of the object 10 is positionally reversed or alternated with respect to the central reference line 11a (FIG. 3) of the inspection object.

After passing through the lower prism 13, the image rays enter the upper prism 14 only from one incident surface 14b thereof due to the above-mentioned offset positioning of the object 10, and exit out only from one exit surface 14c for entry into the image pickup unit 5, as shown in FIG. 4. Thus, no image reversal or alternation occurs at the upper prism, and the upper prism serves only the purpose of correcting optical distortion which might be caused by the lower prism 13.

Figure 5:
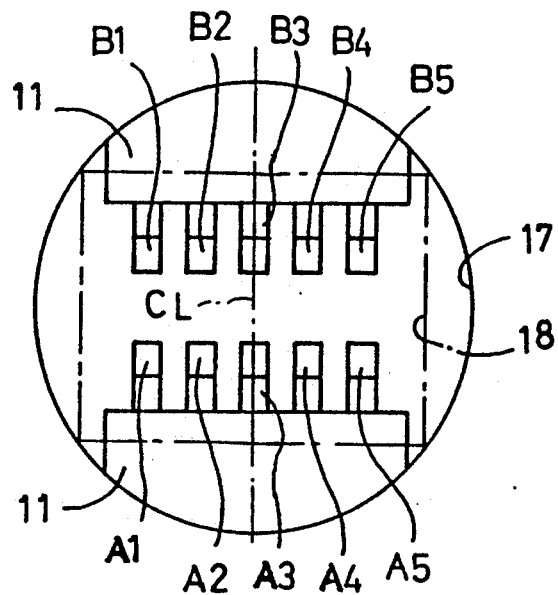
FIG. 5 is a view showing an image of the inspection object.
Figure 6:
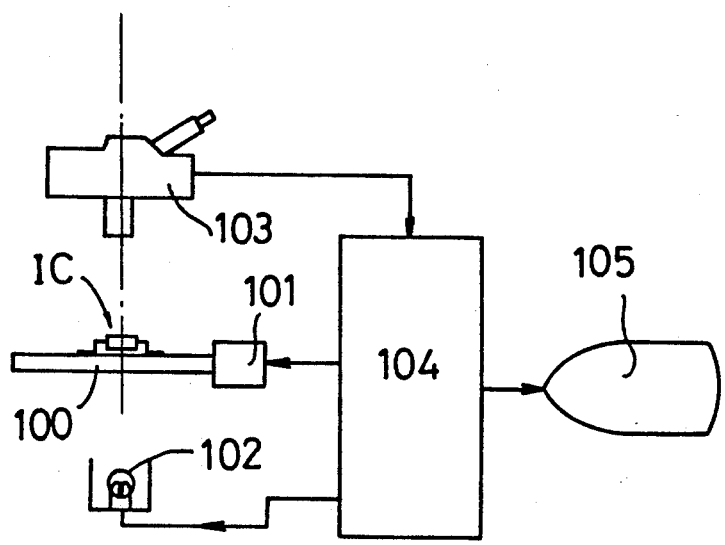
FIG. 6 is a schematic view showing a prior art image recognition apparatus.
Figure 7:
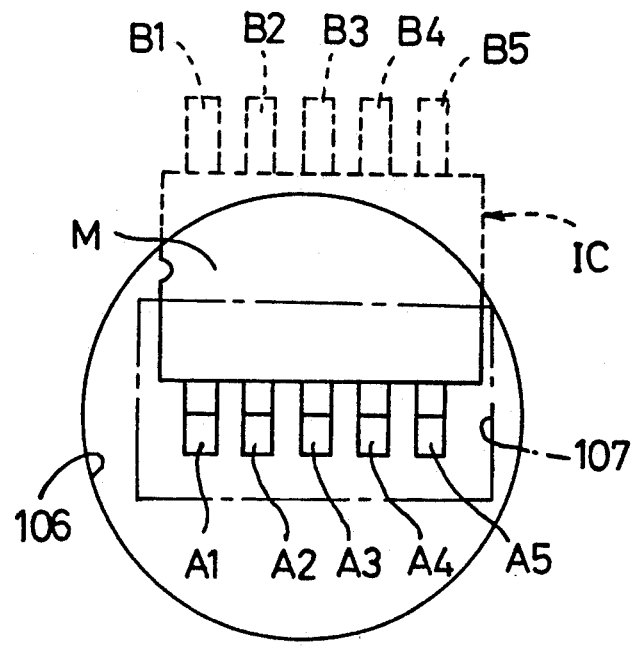
FIG. 7 is a view showing an image of an inspection object obtainable by the prior art image recognition apparatus.

FIG. 5 shows a visual field 17 provided by the image pickup unit 5 as well as a display field 18 (indicated by phantom lines) provided by the display 8. As clearly appreciated, the arrays of leads A1-A5, B1-B5 are simultaneously included within the display field 18 (and the visual field 17 as well) because of the image alternation provided by the lower prism 13. Thus, once the position of the support 3 is properly adjusted, it is possible to perform necessary checking (e.g. appearance, lead pitch, and etc.) simultaneously with respect to both lead arrays. Further, it is unnecessary to reduce the magnification of the image pickup apparatus 5 (the object lens 5a) for the purpose of widening the visible range available for the limited visual field 17 (the display field 18), so that the resolution of the image can be maintained sufficiently high.

As described, the inspection object 10 is arranged offset toward one end 13A of the lower prism 13. If the test object is arranged at the middle between both ends 13A, 13B of the lower prism, the image of the object is positionally alternated by the upper prism 14 with respect to a transverse central line CL (see FIG. 5), which results in that the image of the leads A1-A5, B1-B5 is disordered in arrangement pattern.

The central processing unit 7 processes the image data of the leads A1-A5, B1-B5. The CPU incorporates ROM (Read Only Memory) for previously storing comparison data (e.g. the required number of leads, reference lead shape, reference lead pitch, dimensional tolerances, and etc.) and control program, RAM (Random Access Memory) for storing and reading out the detected image data (e.g. the detected number of leads, actual lead shape, actual lead pitch, and etc.), an input-output interface, and other necessary process elements. Thus, the CPU is capable of comparing the detected image data with the reference data to determine whether the object 10 is acceptable or not.

The manipulator 9 is caused by the CPU 7 to reject unacceptable objects into a reject box and to orderly introduce acceptable objects into an accept box. Further, the CPU may cause an unillustrated marker to make a reject indication on each unacceptable object. Alternatively, the operator may perform manual sorting by watching the monitor display 8.

According to the present invention, the image of the inspection object 10 is positionally reversed or alternated with respect to the central reference line 11a upon passing through the lower prism 13. Thus, though the respective arrays of leads A1-A5, B1-B5 are actually located away from the reference line 11a, the image of the respective lead arrays is brought toward the center of the visual field 17, thereby enabling simultaneous checking of the respective lead arrays within the visual field 17 by a single positional adjustment of the support 3. In this way, it is possible to enhance operational efficiency in performing lead checking.

As described above, the upper prism 14 is provided only for correcting optical distortion, and the intended image reversal or alternation is provided only by the lower prism 13. Thus, the upper prism 14 may be omitted when the optical distortion is acceptable.

According to the illustrated embodiment, the magnifying object lens 5a is provided at the image pickup unit 5 itself. However, the object lens may be located between the support 3 and the image alternating unit 4. Further, the image recognition apparatus 1 may be made to include a second magnifying lens in addition to the lens 5a which is provided at the image pickup unit 5.

In the illustrated embodiment, the illuminator 2 is located below the transparent support 3. However, the illuminator 2 may be located above the support 3, and the image pickup unit 5 may be made to detect reflected image rays. Further, the illuminator 2 may be omitted if sufficient ambient light is available.

Obviously, the image recognition apparatus according to the present invention may be used to check various kinds of inspection objects other than electronic components. For example, the apparatus may be made to check the conductor pattern or soldered lead connection on a printed circuit board.

The present invention being thus described, it is obvious that the same may be varied in many other ways. Such variations are not to be regarded as a departure from the spirit and scope of the invention, and all such modifications as would be obvious to those skilled in the art are intended to be included within the scope of the following claims.

We claim:

1. An image recognition apparatus comprising:
    a support for holding an inspection object, the object having a reference line,
    an image pickup unit, spaced from the support, for detecting an image of the inspection object,
    means for analyzing said image to derive information about the object, the analyzing means being connected to the image pickup unit, and
    means for alternating different image portions of the object, the alternating means being arranged in an optical path between the support and the image pickup unit, the alternating means including a quadratic prism having a longitudinal axis substantially parallel to the support and aligned with and parallel to the reference line, the quadratic prism having two incident surfaces directed toward the support for allowing separate entry of two different image portions of the inspection object, the two different image portions originating from opposite sides of the reference line, the quadratic prism further having two exit surfaces directed away from the support for allowing exit of the two different image portions which have been positionally alternated with each other within the quadratic prism,
    the quadratic prism comprising means for alternating both of said image portions with respect to the reference line, wherein the image pickup unit comprises means for detecting a composite image which comprises said two image portions which have been positionally alternated with respect to the reference line.

2. The apparatus according to claim 1, further comprising a positioner for moving the support in a plane containing it.

3. The apparatus according to claim 1, further comprising a second quadratic prism arranged between the first-mentioned prism and the image pickup unit, the second prism having a longitudinal axis parallel to the support but perpendicular to the longitudinal axis of the first-mentioned prism, the second prism having two incident surfaces directed toward the support and two exit surfaces directed away from the support, the inspection object being located offset toward one end of the first-mentioned prism, the image pickup unit being located offset toward the other end of the first-mentioned prism.

4. The apparatus according to claim 3, wherein the respective prisms are fixedly held in a support tube.

5. The apparatus according to claim 1, wherein the analyzing means comprises a central processing unit connected to the image pickup unit for processing the detected image of the inspection object.

6. The apparatus according to claim 5, further comprising a manipulator connected to the central processing unit for acting on the inspection object.

7. The apparatus according to claim 1, wherein the image pickup unit has a magnifying object lens.

8. In an image recognition apparatus having a support for holding an inspection object, the object having a reference line, an image pickup unit spaced from the support for detecting an image of the inspection object, and means for analyzing said image to derive information about the object, the analyzing means being connected to the image pickup unit,
    the improvement comprising a quadratic prism arranged in an optical path extending between the support and the image pickup unit, the quadratic prism having a longitudinal axis substantially parallel to the support and aligned with and parallel to the reference line, the quadratic prism having two incident surfaces directed toward the support for allowing separate entry of two different image portions of the inspection object, the two different image portions originating from opposite sides of the reference line, the quadratic prism further having two exit surfaces directed away from the support for allowing exit of the two different image portions which have been positionally alternated with each other within the quadratic prism,
    the quadratic prism comprising means for alternating both of said image portions with respect to the reference line, wherein the image pickup unit comprises means for detecting a composite image which comprises said two image portions which have been positionally alternated with respect to the reference line.

9. The improvement according to claim 8, further comprising a positioner for moving the support in a plane containing it.

10. The improvement according to claim 8, further comprising a second quadratic prism arranged between the first-mentioned prism and the image pickup unit, the second prism having a longitudinal axis parallel to the support but perpendicular to the longitudinal axis of the first-mentioned prism, the second prism having two incident surfaces directed toward the support and two exit surfaces directed away from the support, the inspection object being located offset toward one end of the first-mentioned prism, the image pickup unit being located offset toward the other end of the first-mentioned prism.

11. The improvement according to claim 10, wherein the respective prisms are fixedly held in a support plane.

12. The improvement according to claim 8, wherein the analyzing means comprises a central processing unit connected to the image pickup unit for processing the detected image of the inspection object.

13. The improvement according to claim 12, further comprising a manipulator connected to the central processing unit for acting on the inspection object.

14. The improvement according to claim 8, wherein the image pickup unit has a magnifying object lens.

* * * * *